(12) United States Patent
Nanba

(10) Patent No.: US 6,445,637 B2
(45) Date of Patent: Sep. 3, 2002

(54) SEMICONDUCTOR MEMORY DEVICE WITH A REFRESH FUNCTION

(75) Inventor: Yasuhiro Nanba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/815,802

(22) Filed: Mar. 23, 2001

(30) Foreign Application Priority Data

Mar. 29, 2000 (JP) ................................. 2000-092200

(51) Int. Cl.[7] .................................................. G11C 7/00
(52) U.S. Cl. .................................... 365/222; 365/194
(58) Field of Search ................................ 365/222, 194, 365/201, 189.09, 189.05, 193, 233

(56) References Cited

U.S. PATENT DOCUMENTS 5,805,508 A * 9/1998 Tobita ................... 365/189.09
5,991,214 A * 11/1999 Merritt et al. ............. 365/201
6,260,128 B1 * 7/2001 Ohshima et al. ............ 711/169

FOREIGN PATENT DOCUMENTS

| JP | 7-107792 | 11/1995 | ......... G11C/11/401 |
| JP | 10-112186 | 4/1998 | ......... G11C/11/41 |
| JP | 11-283397 | 10/1999 | ......... G11C/29/00 |

* cited by examiner

Primary Examiner—David Lam
(74) Attorney, Agent, or Firm—Michael Best & Friedrich

(57) ABSTRACT

A semiconductor memory device having a refresh function to restore data stored in a memory cell, comprises a delay switching block for delaying a signal for deactivating a word line in a self-refresh operation as compared with the signal in a CBR refresh operation. The delay switching block comprises: a first signal path for allowing the signal for deactivating the word line to pass; a second signal path for delaying the signal for deactivating the word line by a predetermined time; and a path selecting block for selecting the first signal path in the CBR refresh operation, and for selecting the second signal path in the self-refresh operation.

6 Claims, 5 Drawing Sheets

SEMICONDUCTOR MEMORY DEVICE WITH A REFRESH FUNCTION

BACKGROUND OF THE INVENTION

1. Field of the Invention

The present invention relates to a semiconductor memory device, and in particular, to a dynamic random access memory (DRAM) which has a refresh function.

2. Description of the Related Art

A conventional art will now be described with reference to the drawings. A dynamic random access memory (DRAM) is a volatile memory for storing data in memory cell capacitor (memory cell capacity). FIG. 4A conceptually shows the structure of the periphery of the memory cells of the DRAM. A pair of digit lines D and DB is provided for a sense amplifier SA. A memory cell MC is provided at the intersection of the digit lines D and DB and a word line WL.

The memory cell MC comprises a memory cell capacitor Cm and a memory cell transistor Tm. The level of the counter electrode of the memory cell capacitor (memory cell capacitor counter electrode level) HVCD is applied to one of the electrodes of the memory cell capacitor Cm. The other electrode is connected to the source of the memory cell transistor Tm. The gate of the memory cell transistor Tm is connected to the word line WL, and the drain of the memory cell transistor Tm is connected to the digit line D or DB.

In order to prevent the data stored in the memory cell capacitor Cm (hereinafter referred to as memory cell data) from being lost, a refresh operation which is peculiar to the DRAM is required. The refresh operation drives the word line WL to select the memory cell MC. Then, the sense amplifier SA amplifies the memory cell data which has been read from the memory cell MC to the digit lines, and the data is then written in the same memory cell MC.

The refresh operation will now be explained with reference to the timing chart of FIG. 4B. When an internal RASB signal, which is described below, is changed from a high level to a low level, the word line WL specified by the address (not shown) at that time is selected, and is driven to a high level. When the word line WL is selected, the memory cell transistor Tm is turned on, and therefore the memory cell data which is stored in the memory cell capacitor Cm appears on the digit line D.

The initial level (electric potential) of the digit lines D and DB is the same as the memory cell capacitor counter electrode level HVCD. The level of the digit line varies depending on the electric charge stored in the memory cell capacitor Cm. That is, when the word line WL is selected, the electric potential Vcell of the memory cell data stored in the memory cell capacitor Cm is determined based on the ratio of the capacity of the digit line D to the memory cell capacitor Cm. When the memory cell data is at a high level, the level of the digit line D is higher than the memory cell capacitor counter electrode level. The level of the digit line DB is maintained at the memory cell capacitor counter electrode level.

Subsequently, the difference in electric potential between the digit lines D and DB is amplified, and the RASB signal is reset from a low level to a high level. Then, the word line WL is driven to a low level, and therefore the memory cell transistor Tm is turned off. Thus, the data on the digit line, which had been amplified until the word line WL was started to be driven at a low level, is returned to and stored in the memory cell capacitor Cm.

This is the refresh operation to restore the memory cell data. The operation for storing the data into the memory cell capacitor Cm is termed "restore", and the level of data given to the memory cell capacitor Cm is termed a "restore level". When the restore operation is insufficient and the restore level is low, the time of holding (maintaining) the data in the memory cell is shortened. Thus, the maintenance of the memory cell data is degraded. As the time for which the RASB signal is maintained at a low level is lengthened, the time for which the word line has been selected is lengthened, the restore operation becomes sufficient, and the restore level is satisfactory. The time for which the RASB signal is maintained at a low level is termed a tRAS period.

There are two kinds of refresh operations. One is a CBR refresh operation, and the other is a CBR self-refresh operation (hereinafter referred to as self refresh). The CBR is an abbreviation of "CAS Before RAS", and is derived from the entry to the refresh operation in response to an external column address strobe signal CAS before the input of an external row address strobe signal RAS when the DRAMs of FP (Fast Page) or EDO (Extended Data Out) are used. However, since the synchronous DRAM (SDRAM) provides command control based on a clock, the CBR refresh operation is not significant at present.

In the CBR refresh operation, on receiving an externally input command, an internal YRF signal, which is described below, is increased to a high level by one shot (one pulse) as shown in FIG. 5. This is a trigger to conduct the refresh. In the self-refresh, the YRF signal repeats shots regardless of the external input. Thus, the refresh operation is automatically conducted. The details of this operation will be discussed below. Although the CBR refresh operation and the self-refresh operation are different only in that the YRF signal is produced by the external signal in the CBR refresh operation and the YRF signal is automatically and internally produced in the self-refresh operation, the operations are identical in that the YRF signal controls the internal refresh operation.

FIG. 5 shows a conventional circuit for producing the internal RASB signal in the refresh operation. This circuit comprises NOR (negative OR, or not OR) gates 71 and 72. The output from the NOR gate 71 is connected to one of the inputs of the NOR gate 72, and the output from the NOR gate 72 is connected to one of the inputs of the NOR gate 71. The YRF signal is applied to the other input of the NOR gate 71, and an RTO signal, which is described below, is applied to the other input to the NOR gate 72. The RTO signal is internally produced to deactivate the word line.

FIG. 6 shows the waveforms of the YRF signal, the RTO signal, the RASB signal, and a SRS signal which is the entry signal for the self-refresh mode. The SRS signal is at a high level only when in the self-refresh operation, and defines the entry to and the exit from the self-refresh operation. As described above, the YRF signal is a one-shot signal at a high level which is produced by the external command in the CBR refresh operation and which is automatically and internally produced in the self-refresh operation. This YRF signal determines the following refresh operation.

The RTO signal deactivates the word line. When the RASB signal is increased to a high level, the RTO signal is reduced to a low level with a short delay (several nanoseconds) after the rising of the RASB signal. Then, several nanoseconds after the RASB signal has been reduced to a low level to complete the sense operation, the RTO signal is increased to a high level. As shown in FIG. 5, the RASB signal is produced from the YRF signal and the RTO signal, and defines the time period for which the word line has been selected. For normal initial conditions, the SRS signal is at a low level, the YRF signal is at a low level, the RTO signal is at a low level, the RASB signal is at a low level, and the output from the NOR gate 72 is at a low level.

The operation of the circuit shown in FIG. 5 will now be-explained with reference to the timing chart of FIG. 6. In the CBR refresh operation, the YRF signal is increased to a high level by the external command. Then, the RASB signal which is the output from the NOR gate 71 is reduced to a low level. Further, the output from the NOR gate 72 is reduced to a low level. Thereafter, the YRF signal is reduced to a low level. Then, the RTO signal is increased to a high level with the delay of several nanoseconds from the reduction of the YRF signal. Then, the output from the NOR gate 72 is reduced to a low level. Then, the RASB signal, which is the output from the NOR gate 71, is increased to a high level. Then, the RTO signal is reduced to a low level with a delay of several nanoseconds after the rising of the RASB signal. This process is repeated whenever the external command is input.

In the self-refresh operation, the SRS signal is increased to a high level by the input of the SRF (self refresh) command. Then, the YRF signal is automatically and internally produced without any external command. The following operation is the same as that of the CBR refresh operation. The word line is selected based on the clocks of the RASB signal, and the rewriting (restore) of the data into the memory cell MC is conducted. In the CBR refresh operation and in the self-refresh operation, the address is automatically produced by an internal counter, and the word lines in the memory array are successively selected. Thus, in the conventional technique, the RASB signal is produced in the same signal path in the CBR refresh operation and in the self-refresh operation.

The electric current consumption (average operating current) in the self-refresh operation is desired to be lower than that in the CBR refresh operation according to the product specifications. The electric current consumption depends on an operating cycle. Therefore, the cycle of the self-refresh operation is set to be longer than the cycle of the CBR refresh operation, thereby reducing the electric current consumption in the self-refresh operation.

However, because the RASB signal is produced in the same signal path, the tRAS period which defines the period for rewriting the data in the memory cell is also the same in the self-refresh operation and in the CBR refresh operation. Because the operating cycle of the self-refresh operation is longer than that of the CBR refresh operation, the time for which the memory cell is not selected is lengthened, and the data holding time of the memory cell is shortened as the tRAS time is shortened. Therefore, the restore by the self-refresh operation is insufficient as compared with the CBR refresh operation, and there is the problem that the data holding time of the memory cell is shortened.

BRIEF SUMMARY OF THE INVENTION

It is therefore an object of the present invention to provide a semiconductor memory device which can achieve sufficient restore even in the self-refresh operation and which requires low electric current consumption.

In the first aspect of the present invention, the semiconductor memory device having a refresh function to restore data stored in a memory cell, comprises a delay switching block (40) for delaying a signal for deactivating a word line in a self-refresh operation as compared with the signal in a CBR refresh operation.

In the second aspect of the present invention, the delay switching block comprises: a first signal path (B) for allowing the signal for deactivating the word line to pass; a second signal path (A) for delaying the signal for deactivating the word line by a predetermined time; and a path selecting block (C) for selecting the first signal path in the CBR refresh operation, and for selecting the second signal path in the self-refresh operation.

In the third aspect of the present invention, the path switching block is fixed to select the first signal path in test mode.

The semiconductor memory device of the present invention has a circuit for switching the signal path for resetting an internal ROW system signal depending on whether it is the self-refresh operation or the CBR refresh operation. The present invention extends a tRAS time to ensure the restore level. In test mode, the signal path for resetting an internal ROW system signal is fixed to the signal path for the CBR refresh operation, in order to determine the data holding time at the time of exit from the self-refresh operation. Therefore, the cell having the worst performance can be identified.

According to the present invention, even when the CBR operation which requires low electric current consumption is conducted, a sufficient restore level can be achieved, thereby preventing the deterioration of the data stored in the memory cell in the self-refresh operation as compared with the CBR refresh operation.

DETAILED DESCRIPTION OF THE INVENTION

The semiconductor memory device of the present invention will be explained with reference to the drawings.

Figure 1:
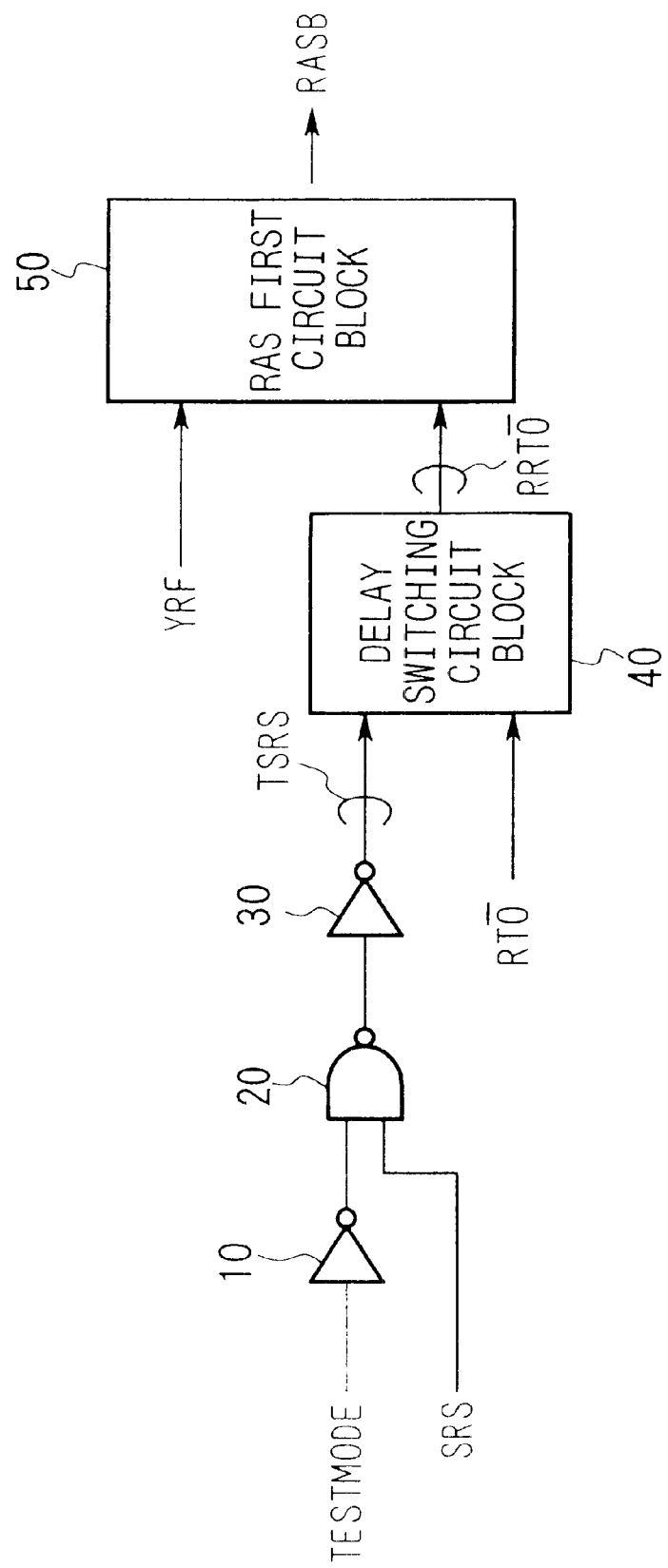
FIG. 1 is an RASB producing circuit of the semiconductor memory device of the embodiment of the present invention.

The semiconductor memory device is a DRAM with a refresh function for restoring data held by a memory cell, and includes a circuit for producing an RASB signal (hereinafter referred to as the RASB producing circuit) shown in FIG. 1. The RASB producing circuit comprises an inverter 10, a not AND (NAND) gate 20, an inverter 30, a delay switching circuit block 40, and an RAS first stage circuit block 50, and outputs the RASB signal in response to the input of a YRF signal, an SRS signal, an RTO signal, and a TESTMODE signal which is at a high level in test mode.

The TESTMODE signal, which is at a high level in test mode, is applied to an input of the inverter 10. The output from the inverter 10 is connected to one of the inputs of the NAND gate 20, and the SRS signal is applied to the other input. The output from the NAND gate 20 is connected to an input of the inverter 30. An output signal from the inverter 30 is a TSRS signal. The TSRS signal has the same logic value as the SRS signal when the TESTMODE signal is at a low level (in the normal operating mode), and is fixed to a low level when the TESTMODE signal is at a high level (in the test mode). That is, the TSRS signal acts as the SRS signal when in normal operating mode, and is fixed when in test mode.

The delay switching circuit block 40 switches the amount of delay of the RTO signal which defines the deactivation of the word line in the self-refresh operation, with respect to the CBR refresh operation. The delay switching circuit block 40 switches the amount of delay of the RTO signal based on the TSRS signal, and outputs the delayed RTO signal as an RRTO signal. The RAS first stage circuit block 50 outputs the RASB signal with the tRAS period defined by the YRF signal and the RRTO signal.

Figure 2:
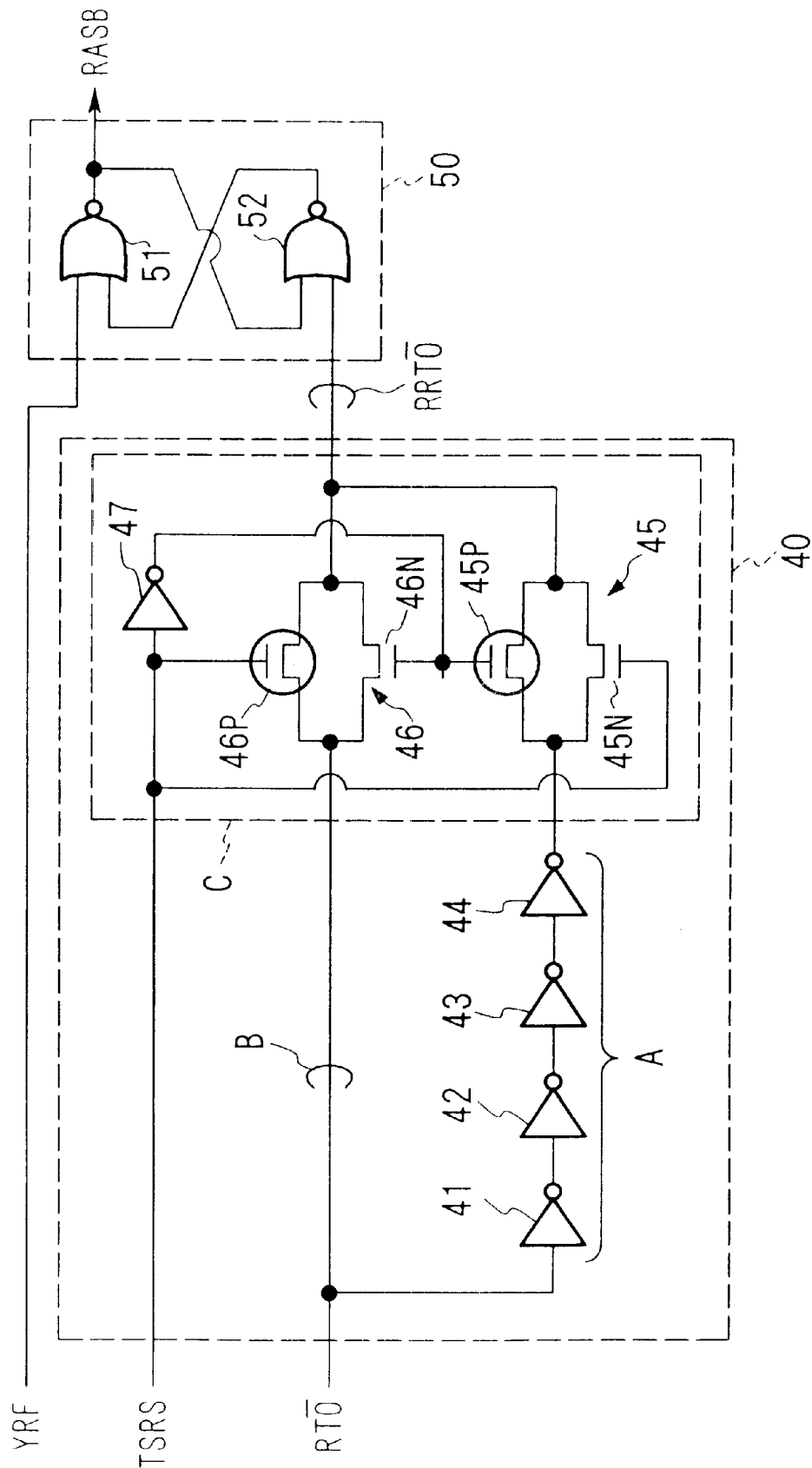
FIG. 2 is a block diagram showing the delay switching circuit block and an RAS first stage circuit block of the embodiment of the present invention.

FIG. 2 shows examples of the delay switching circuit block 40 and the RAS first stage circuit block 50.

The delay switching circuit block 40 comprises a signal path B for transmitting the RTO signal without any delay, a signal path A comprising an inverter array (an even number of inverters 41 to 44) for delaying the RTO by a predetermined time, and a path selecting circuit C for selecting the signal path B when in the CBR refresh operation and for selecting the signal path A when in the self-refresh operation. The RTO signal is commonly supplied to the signal path A (that is, to the input to the inverter 41 which is the first stage of the inverter array) and to the signal path B.

The path selecting circuit C comprises a transfer gate 45 for receiving the signal transferred through the signal path A, a transfer gate 46 for receiving the signal transferred through the signal path B, and an inverter 47 for inverting the TSRS signal. The transfer gate 45 comprises a P-ch transistor 45P and an N-ch transistor 45N, and transmits the RTO signal, which has been transferred through the signal path A, under the control of the TSRS signal. One of the terminals of the P-ch transistor 45P and one of the terminals of the N-ch transistor 45N are connected in common to the output from the inverter 44 of the last stage of the signal path A. The TSRS signal is applied to the gate of the N-ch transistor 45N, and the inverted signal of the TSRS signal (the output signal from the inverter 47) is applied to the gate of the P-ch transistor 45P.

The transfer gate 46 comprises a P-ch transistor 46P and an N-ch transistor 46N, and allows the RTO signal which has been transferred through the signal path B, under the control of the TSRS signal. One of the terminals of the P-ch transistor 46P and one of the terminals of the N-ch transistor 46N are connected in common to the signal path B. The TSRS signal is applied to the gate of the P-ch transistor 46P, and the inverted signal of the TSRS signal (the output signal from the inverter 47) is applied to the gate of the N-ch transistor 45N. The other terminal of the electric current of the transfer gate 46 and the other terminal of the electric current path of the transfer gate 45 are connected in common, and act as the output from the delay switching circuit block 40.

The RAS first stage circuit block 50 comprises a flip-flop which comprises NOR (Not OR) gates 51 and 52. That is, the output from the NOR gate 51 is connected to one of the inputs of the NOR gate 52, and the output from the NOR gate 52 is connected to one of the inputs of the NOR gate 51. The YRF signal is supplied to the other input of the NOR gate 51, and the output from the delay switching circuit block 40 is connected to the other input of the NOR gate 52. The output from the NOR gate 51 acts as the output from the RAS first stage circuit block 50.

The RASB signal will now be explained. For example, in a synchronous DRAM (SDRAM), the internal RASB signal is changed from a high level to a low level in response to the input of an external ACT (active) command. Then, an internal ROW circuit is activated, and the word line selected by the address is activated. The reset of the RASB signal is achieved by the input of a PRE (pre-charge) command. Thus, the ROW circuit normally operates. In the CBR refresh operation, an external REF (CBR refresh) command is input, and one shot (one pulse) of the YRF signal is output. Then, the RASB signal is changed from a high level to a low level.

The RTO signal will now be explained. This signal is changed from a low level to a high level after the selected word line in the ROW system has been activated, and after the memory cell data has appeared on a digit line and has been amplified by a sense amplifier. If this signal is not at a high level, then the RASB signal cannot be reset. This prevents the input of a wrong command by the user, and prevents the loss of the cell data, although product specifications define the time (the number of clocks) from the ACT command input to the PRE command input.

The CBR refresh operation is conducted using the RTO signal. In response to the increase of the RASB signal to a high level (completion of the sense operation), the RASB signal can be reset without any external command input (can be changed from a low level to a high level). In response to the reset of the RASB signal (change from a low level to a high level), the RTO signal is reset (changed from a high level to a low level). The series of steps are conducted in the CBR refresh operation.

In the self-refresh operation, the YRF signal internally and automatically produces clocks at a predetermined period in response to the input of the SRF (self refresh) command to refresh the data. The difference from the CBR refresh operation described above is that the YRF signal in the CBR refresh operation is produced in response to the input of the external REF command, while the YRF signal in the self-refresh operation is internally produced.

Figure 3A:
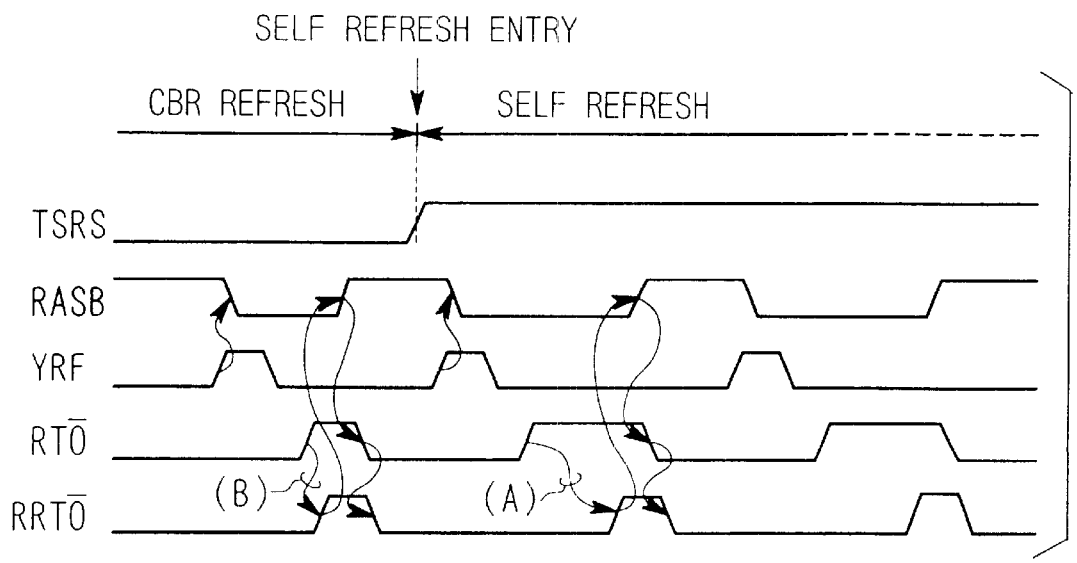
FIGS. 3A and 3B are timing charts for explaining the refresh operation of the semiconductor memory device of the present invention.
Figure 3B:
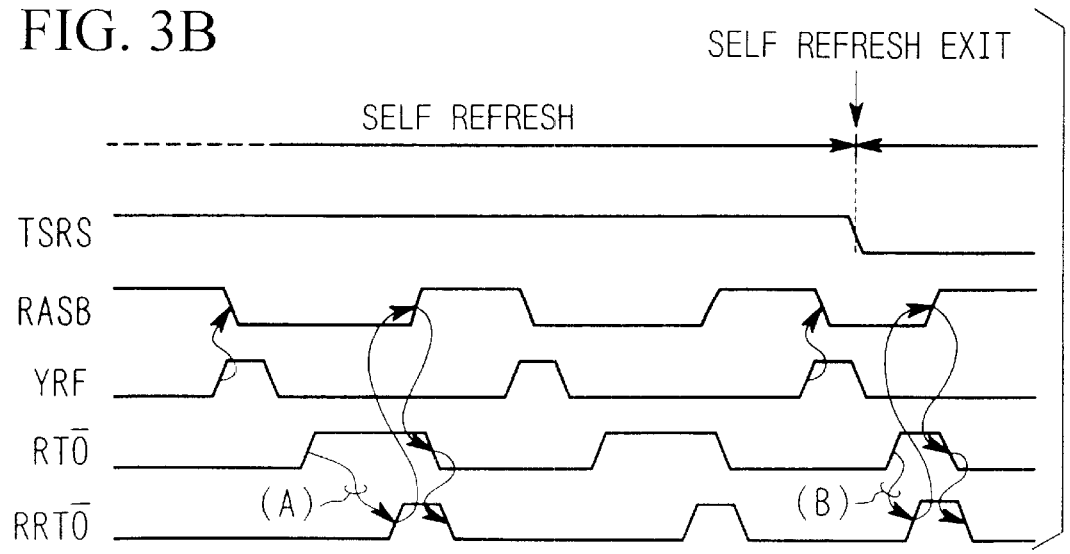
Figure 4A:
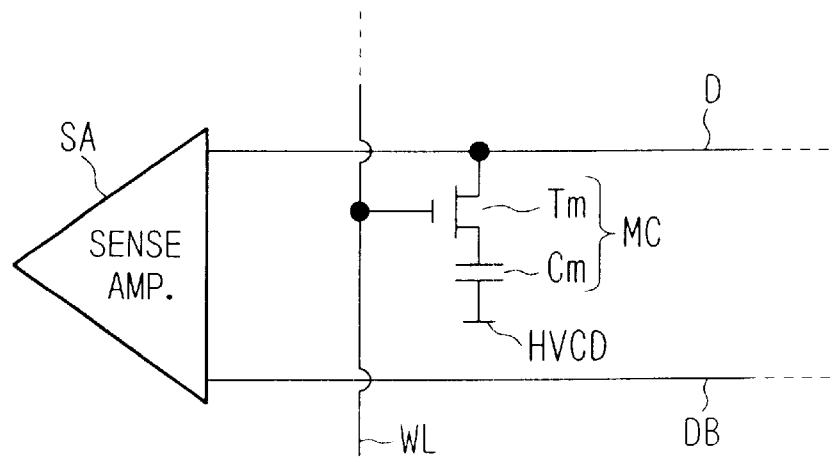
FIGS. 4A and 4B are diagrams for explaining the refresh operation of a DRAM.
Figure 4B:
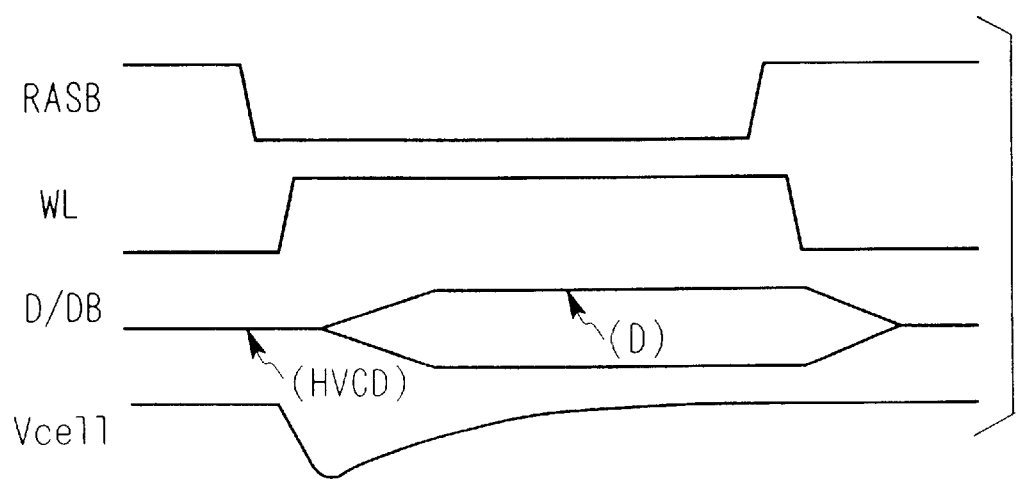
Figure 5:
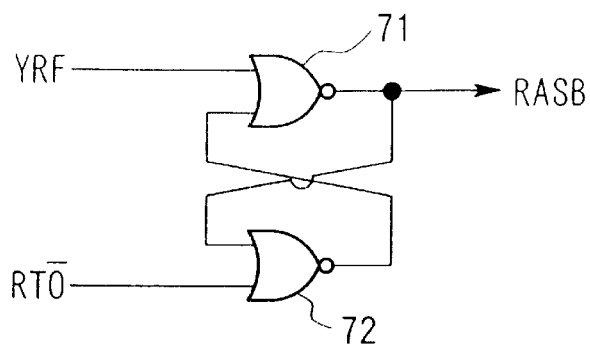
FIG. 5 is a diagram showing the circuit for performing the refresh operation of the conventional art.
Figure 6:
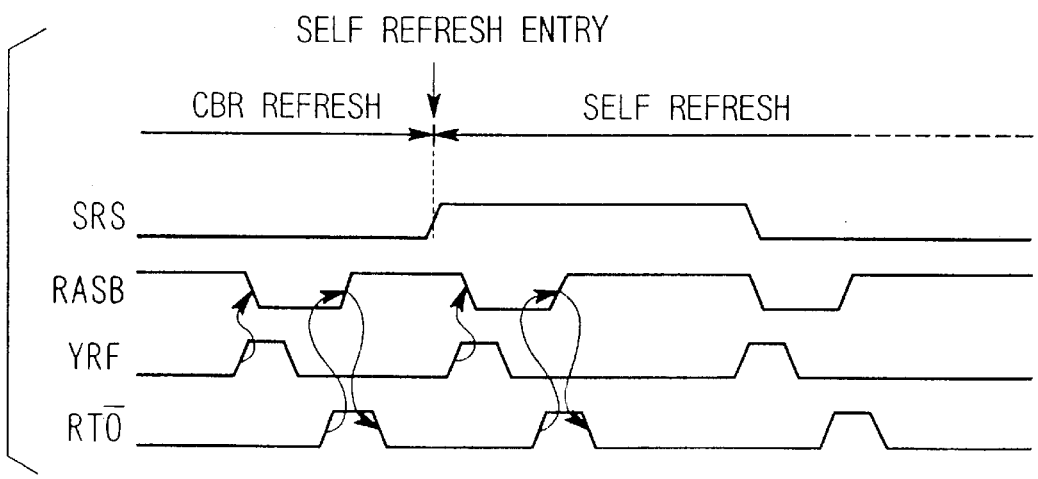
FIG. 6 is a timing chart for explaining the refresh operation of the conventional art.

The operation of the circuit shown in FIGS. 1 and 2 will be explained with reference to the timing chart of FIG. 3.

In the initial state before the entry to self-refresh mode, the TESTMODE signal and the SRS signal are at a low level. Therefore, the output from the NAND gate 20 shown in FIG. 1 is at a high level, and the TSRS signal output from the inverter 30 is at a low level. In FIG. 2, the output from the inverter 47, which has received the TSRS signal at a low level, is at a high level. Therefore, the P-ch transistor 46P and the N-ch transistor 46N are turned on, while the P-ch transistor 46P and the N-ch transistor 46N are turned off. In FIG. 2, the RTO signal is transferred through the signal path B and the transfer gate 46, and is output as the RRTO signal. The RTO signal is not delayed and is output to the RAS first stage circuit block 50.

In response to the input of the SRF command, the mode enters self-refresh mode. In order to exit from self-refresh mode, the SRS signal is set to a high level. In FIG. 1, when the TESTMODE signal is at a low level, the output from the inverter 10 is at a high level, and after the entry to the self-refresh mode, the SRS signal is at a high level, and the output from the NAND gate 20 is therefore at a low level. Therefore, the TSRS signal output from the inverter 30 is at a high level.

When the TSRS signal is increased to a high level, the output from the inverter 47 is reduced to a low level as shown in FIG. 2. Thus, the P-ch transistor 45P and the N-ch transistor 45N are turned off. As a result, the signal path of the RTO signal is switched from the signal path B to the signal path A, and the RTO is therefore transferred through the signal path A and the transfer gate 45, and is output as the RRTO signal. The RTO signal is delayed by the predetermined time by the inverters 41 to 44, and is output as the RRTO signal to the RAS first stage circuit block 50.

As described above, when the TESTMODE signal is at a low level (hereinafter referred to as the normal condition), the path selecting circuit C selects the signal path B before the entry to self-refresh mode, and selects the signal path A after the entry to self-refresh mode. In the normal condition, the signal path A is selected before the exit from the self-refresh mode, and the signal path B is selected after the exit. When the TESTMODE signal is at a high level (hereinafter referred to as test mode), the path selecting circuit is fixed to select the signal path B regardless of the entry to self-refresh mode. In the example shown in FIG. 2, the difference between the signal path A and the signal path B is that the signal path A delays the signal by the four stages of the inverter array (inverters 41 to 44).

In response to the input of the refresh command (self refresh or CBR refresh command), the YRF signal is changed from a low level to a high level. Then, the RASB signal output from the NOR gate 51 is reduced to a low level. At that time, because the RRTO signal is at a low level, the output from the NOR gate 52 is changed from a low level to a high level. After several nanoseconds have passed, the YRF signal is reduced to a low level. At this point, the RASB signal is maintained at a low level. When the RTO signal is increased to a high level after the completion of the sense operation, the RRTO signal is increased to a high level. The signal is path B is selected only when in the normal self-refresh operation, while in the other operation the signal path A is selected. In response to the RRTO signal at a high level, the output from the NOR gate 52 is reduced to a low level, and the output from the NOR gate 51 is increased to a high level, so that the ROW system circuit is reset. Thereafter, in response to the RASB signal at a high level, the RTO signal and the RRTO signal are reduced to a low level. Then, this series of steps is repeated.

The important point is that, as obvious from the above-described circuit operation, when the signal path A is selected, the RTO signal is delayed so that the point at which the RTO signal is changed to a high level is delayed. This lengthens the tRAS time (the time for which the RASB signal has been at a low level) when the signal path A is selected, as compared with the case in which the signal path B is selected. Even in the self-refresh operation whose operating cycle is long, the restore level is made sufficient. Therefore, the waveform of the RASB signal (tRAS time) is adjusted depending on the cycle of the refresh operation, and a suitable restore level can be obtained.

In order to satisfy the product specifications which define the cycle tRC1 of the refresh command in the next cycle after the exit from the self-refresh mode, when the SRS signal is set to a low level in order to exit the self-refresh mode, the signal path of the RTO signal must be returned to the signal path B for the CBR refresh operation. In the self-refresh operation, the signal path A is selected in order to delay the reset of the RASB signal so as to improve the restore level. In order to satisfy the cycle tRC1 of the refresh command, the RTO signal for the last memory cell at the time of exit from the self-refresh mode, however, has to pass through the signal path B for the CBR refresh operation, and the tRAS time is the same as that in the CBR refresh operation. Therefore, the restore level for the last memory cell at the time of exit from the self-refresh mode is not always sufficient.

However, the probability is extremely low that the data holding performance of the product will be measured based on the last memory cell at the time of exit from the self-refresh mode. This means that the probability is low that the cell whose holding performance is the worst will be the last cell at the time of exit from the self-refresh mode. In the self-refresh operation, the restore levels of the other memory cells are improved because the tRAS time is lengthened. That is, the data holding time of the memory cells, other than the last memory cell at the time of exit from the self refresh mode, has a guard band (safety range), thereby improving the overall data holding performance.

Next, the operation in test-mode will be explained.

Test-mode is a mode for analyzing the internal operation, and for reducing the selecting time by a special external command which prevents a wrong entry by the user (the mode enters test mode by inputting a special address while setting a mode register). There are a number of test modes to which different addresses are assigned, and by which the user can select one of the test modes. The TESTMODE signal is assigned to one of the test modes. The preset special external command changes the TESTMODE signal from a low level to a high level.

When the TESTMODE signal is increased to a high level, the output from the inverter 10 is reduced to a low level, and the output from the NAND gate 20 is increased to a high level regardless of the level of the SRS signal. Then, the TSRS signal output from the inverter 30 is reduced to a low level. The signal path of the RTO signal is always fixed to the signal path B. Since test mode selects the signal path B in the self-refresh operation, the RTO signal is not delayed, and the tRAS time can be shortened. Therefore, the data holding performance (limit value) can be measured, and the restore condition in the self-refresh operation can be reliably checked.

According to the above embodiment, the time for inputting the external command in the self-refresh operation satisfies the specification of the cycle tRC1. Further, the tRAS time for the memory cells, other than the last memory cell at the time of exit from the self-refresh mode, is lengthened while performing the restore operation, thereby improving the data holding performance. Further, test-mode sets the tRAS time to be identical to that of the CBR refresh operation, and therefore the data holding performance in the self-refresh operation can be measured.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. A semiconductor memory device having a refresh function to restore data stored in a memory cell, comprising:
   a delay switching block for delaying a signal for deactivating a word line in a self-refresh operation as compared with the signal in a CBR refresh operation, wherein said delay switching block comprises:
   a first signal path for enabling the signal for deactivating the word line to pass;
   a second signal path for delaying the signal for deactivating the word line by a predetermined time; and
   a path selecting block for selecting the first signal path for the CBR refresh operation, and for selecting the second signal path for the self-refresh operation, so as to enable the signal to pass through either one of said first and second signal paths depending on whether there is the CBR refresh operation or the self refresh operation.

2. A semiconductor memory device according to claim 1, wherein the delay switching block is fixed to select the first signal path in a test mode.

3. A semiconductor memory device according to claim 1, wherein the second signal path comprises a plurality of inverters connected in series.

4. A semiconductor memory device according to claim 1, wherein the path selecting block comprises:
   a first transfer gate for allowing the signal, transferred through the first signal path, to pass;
   a second transfer gate for allowing the signal, transferred through the second signal path, to pass; and
   a control signal path for supplying the signal for turning on one of the first transfer gate and the second transfer gate.

5. A semiconductor memory device according to claim 4, wherein
   the first transfer gate comprises a P-ch transistor and an N-ch transistor, electric current paths of the P-ch transistor and the N-ch transistor of the first transfer gate being connected to the first signal path,
   the second transfer gate comprises a P-ch transistor and an N-ch transistor, electric current paths of the P-ch transistor and the N-ch transistor of the second transfer gate being connected to the second signal path, and
   the control signal path is connected to gates of the P-ch transistors and the N-ch transistors.

6. The semiconductor memory device of claim 1 further comprising:
   a plurality of inverters connected in series in said second signal path;
   a first transfer gate connected to the first signal path;
   a second transfer gate connected to the second signal path; and
   a control signal path connected to the first transfer gate and the second transfer gate.

* * * * *